(12) United States Patent
Stevens et al.

(10) Patent No.: US 9,596,794 B2
(45) Date of Patent: Mar. 14, 2017

(54) METHODS FOR APPLYING PROTECTIVE COATINGS TO INTERNAL SURFACES OF FULLY ASSEMBLED ELECTRONIC DEVICES

(71) Applicant: HzO, Inc., Draper, UT (US)

(72) Inventors: Blake Stevens, Morristown, NJ (US); Max Sorenson, Cottonwood Heights, UT (US); Paul S. Clayson, Draper, UT (US); Scott B. Gordon, Salt Lake City, UT (US)

(73) Assignee: HZO, Inc., Draper, UT (US)

( * ) Notice: Subject to any disclaimer, the term of this patent is extended or adjusted under 35 U.S.C. 154(b) by 0 days.

(21) Appl. No.: 14/178,112

(22) Filed: Feb. 11, 2014

(65) Prior Publication Data

US 2014/0160650 A1   Jun. 12, 2014

Related U.S. Application Data

(63) Continuation of application No. 13/920,836, filed on Jun. 18, 2013.

(Continued)

(51) Int. Cl.
*B05D 5/12* (2006.01)
*H05K 13/00* (2006.01)
(Continued)

(52) U.S. Cl.
CPC ............ *H05K 13/00* (2013.01); *C23C 16/00* (2013.01); *H05K 3/284* (2013.01); *H05K 5/00* (2013.01);
(Continued)

(58) Field of Classification Search
USPC ................ 427/58, 96.2, 96.6, 230, 282, 300
See application file for complete search history.

(56) References Cited

U.S. PATENT DOCUMENTS 3,661,641 A    5/1972   Vigh et al.
4,059,708 A    11/1977  Heiss, Jr. et al.
(Continued)

FOREIGN PATENT DOCUMENTS

CN    101442896 A    5/2009
EP    0 350 031 B1   9/1993
(Continued)

OTHER PUBLICATIONS

United States Patent and Trademark Office, "International Search Report and Written Opinion" mailed Nov. 29, 2013 in PCT application No. PCT/US2013/046392.

(Continued)

*Primary Examiner* — Brian K Talbot
(74) *Attorney, Agent, or Firm* — Kunzler Law Group

(57) ABSTRACT

Methods for applying protective coatings to electronic devices that have already been assembled, and are in a consumer-ready or aftermarket form, are disclosed. In such a method, an electronic device may be at least partially disassembled to expose at least a portion of an interior of the electronic device. A protective coating is applied to some or all of the exposed surfaces of the electronic devices, including one or more internal surfaces, features or components of the electronic device. Thereafter, the electronic device may be reassembled. During and after reassembly, the protective coating resides internally within the electronic device. Systems for applying protective coatings to interior components of previously assembled electronic devices are also disclosed.

24 Claims, 8 Drawing Sheets

Related U.S. Application Data

(60) Provisional application No. 61/660,815, filed on Jun. 18, 2012.

(51) Int. Cl.
*H05K 5/00* (2006.01)
*H05K 3/28* (2006.01)
*C23C 16/00* (2006.01)
*H05K 5/02* (2006.01)

(52) U.S. Cl.
CPC ........... *H05K 5/02* (2013.01); *H05K 13/0046* (2013.01); *H05K 2201/0129* (2013.01); *H05K 2203/1322* (2013.01); *H05K 2203/1338* (2013.01); *H05K 2203/1344* (2013.01); *H05K 2203/1366* (2013.01); *Y10T 29/49716* (2015.01); *Y10T 29/5313* (2015.01)

(56) References Cited

U.S. PATENT DOCUMENTS

| | | | |
|---|---|---|---|
| 4,234,357 A | | 11/1980 | Scheppele |
| 4,254,174 A | | 3/1981 | Flanders et al. |
| 4,255,469 A | * | 3/1981 | McGinness ......... B05B 15/0456 156/247 |
| 4,300,184 A | * | 11/1981 | Colla ................... H01L 23/293 174/546 |
| 4,784,310 A | | 11/1988 | Metzger et al. |
| 4,814,943 A | | 3/1989 | Okuaki |
| 5,009,311 A | | 4/1991 | Schenk |
| 5,024,879 A | | 6/1991 | Massa et al. |
| 5,102,712 A | | 4/1992 | Peirce et al. |
| 5,166,864 A | * | 11/1992 | Chitwood ............ H05K 1/0218 174/351 |
| 5,176,312 A | | 1/1993 | Lowenthal |
| 5,188,669 A | | 2/1993 | Donges et al. |
| 5,246,730 A | | 9/1993 | Peirce et al. |
| 5,271,953 A | * | 12/1993 | Litteral ............................. 427/8 |
| 5,543,008 A | | 8/1996 | Hidber et al. |
| 5,587,207 A | | 12/1996 | Gorokhovsky |
| 5,888,308 A | | 3/1999 | Sachdev et al. |
| 6,280,821 B1 | | 8/2001 | Kadunce et al. |
| 6,447,847 B1 | | 9/2002 | Hynes et al. |
| 6,592,018 B2 | | 7/2003 | Taylor et al. |
| 6,635,553 B1 | | 10/2003 | DiStefano et al. |
| 6,697,217 B1 | | 2/2004 | Codilian |
| 6,940,022 B1 | | 9/2005 | Vinciarelli et al. |
| 6,956,963 B2 | | 10/2005 | Ulrich et al. |
| 6,980,647 B1 | | 12/2005 | Daugherty et al. |
| 7,109,055 B2 | | 9/2006 | McDonald et al. |
| 7,273,767 B2 | | 9/2007 | Ong et al. |
| 7,632,698 B2 | | 12/2009 | Hooper et al. |
| 7,681,778 B2 | | 3/2010 | Gottshall et al. |
| 8,002,948 B2 | | 8/2011 | Haubrich et al. |
| 8,408,379 B2 | | 4/2013 | Malek et al. |
| 8,544,781 B2 | | 10/2013 | Pan et al. |
| 2002/0088636 A1 | * | 7/2002 | Noguchi et al. ............. 174/65 G |
| 2003/0143845 A1 | | 7/2003 | Mori et al. |
| 2004/0056039 A1 | | 3/2004 | Sarajian |
| 2004/0058070 A1 | | 3/2004 | Takeuchi et al. |
| 2004/0065554 A1 | | 4/2004 | Cohen |
| 2004/0100164 A1 | | 5/2004 | Murata et al. |
| 2005/0008848 A1 | | 1/2005 | Saccomanno et al. |
| 2005/0081354 A1 | | 4/2005 | Motzno et al. |
| 2006/0013961 A1 | | 1/2006 | Fournier et al. |
| 2006/0199408 A1 | | 9/2006 | Hoisington et al. |
| 2007/0087131 A1 | | 4/2007 | Hutchinson et al. |
| 2007/0095368 A1 | * | 5/2007 | Girard et al. .................... 134/38 |
| 2007/0157457 A1 | | 7/2007 | Fried |
| 2007/0246820 A1 | | 10/2007 | Zohni et al. |
| 2008/0147158 A1 | | 6/2008 | Zweber et al. |
| 2009/0263581 A1 | * | 10/2009 | Martin et al. .......... 427/255.395 |
| 2009/0263641 A1 | | 10/2009 | Martin, III et al. |
| 2009/0283574 A1 | | 11/2009 | Okazaki et al. |
| 2009/0301770 A1 | | 12/2009 | Cho et al. |
| 2009/0304549 A1 | | 12/2009 | Coulson |
| 2010/0124010 A1 | * | 5/2010 | Shiu et al. ................ 361/679.31 |
| 2010/0203347 A1 | | 8/2010 | Coulson |
| 2010/0277921 A1 | | 11/2010 | Sekowski et al. |
| 2010/0293812 A1 | | 11/2010 | Coulson |
| 2011/0090658 A1 | | 4/2011 | Adams et al. |
| 2011/0094514 A1 | | 4/2011 | Rakow et al. |
| 2011/0231002 A1 | * | 9/2011 | Vienot ................. H05K 13/021 700/110 |
| 2011/0262740 A1 | | 10/2011 | Martin, III et al. |
| 2012/0070145 A1 | | 3/2012 | Wong et al. |
| 2012/0146212 A1 | | 6/2012 | Daubenspeck et al. |
| 2012/0193648 A1 | | 8/2012 | Donofrio et al. |
| 2012/0296032 A1 | * | 11/2012 | Legein et al. .................. 524/544 |
| 2013/0174410 A1 | | 7/2013 | Stevens et al. |
| 2013/0176691 A1 | | 7/2013 | Stevens et al. |
| 2013/0176700 A1 | | 7/2013 | Stevens et al. |
| 2013/0251889 A1 | | 9/2013 | Cox et al. |
| 2013/0286567 A1 | | 10/2013 | Sorenson et al. |
| 2013/0335898 A1 | | 12/2013 | Stevens et al. |

FOREIGN PATENT DOCUMENTS

| | | |
|---|---|---|
| EP | 0 474 194 B1 | 1/1997 |
| JP | 62-248228 | 10/1987 |
| JP | 2005-260106 A | 9/2005 |
| WO | 2011/089009 A1 | 7/2011 |
| WO | PCT/US14/10510 | 1/2014 |

OTHER PUBLICATIONS

United States Patent and Trademark Office, As the International Searching Authority, "International Search Report and Written Opinion," mailed Mar. 13, 2013, in PCT application No. PCT/US2013/020850.

United States Patent and Trademark Office, Acting as the International Searching Authority, "International Search Report and Written Opinion," mailed Apr. 24, 2014, in PCT application No. PCT/US2014/010638.

United States Patent and Trademark Office Acting as the International Searching Authority, "International Search Report and Written Opinion," mailed Dec. 2, 2013, in related international application No. PCT/US2013/046371.

United States Patent and Trademark Office Acting as the International Searching Authority, "International Search Report and Written Opinion" mailed Apr. 30, 2014 in related international application No. PCT/US2014/010526.

Chinese State Intellectual Property Office, "Notification of the First Office Action and Search Report," mailed Mar. 25, 2015 in Chinese application No. 201480000037.2.

\* cited by examiner

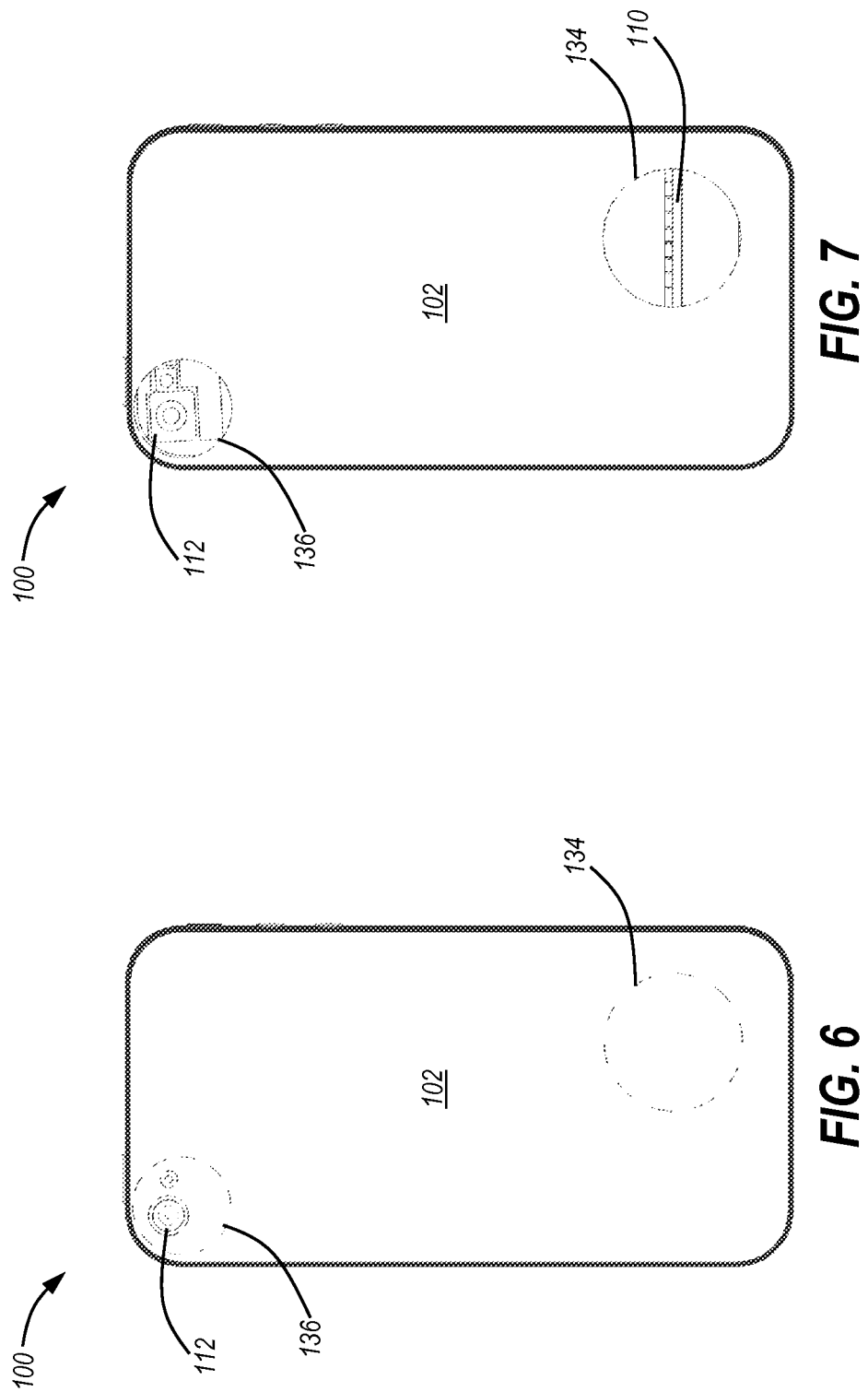

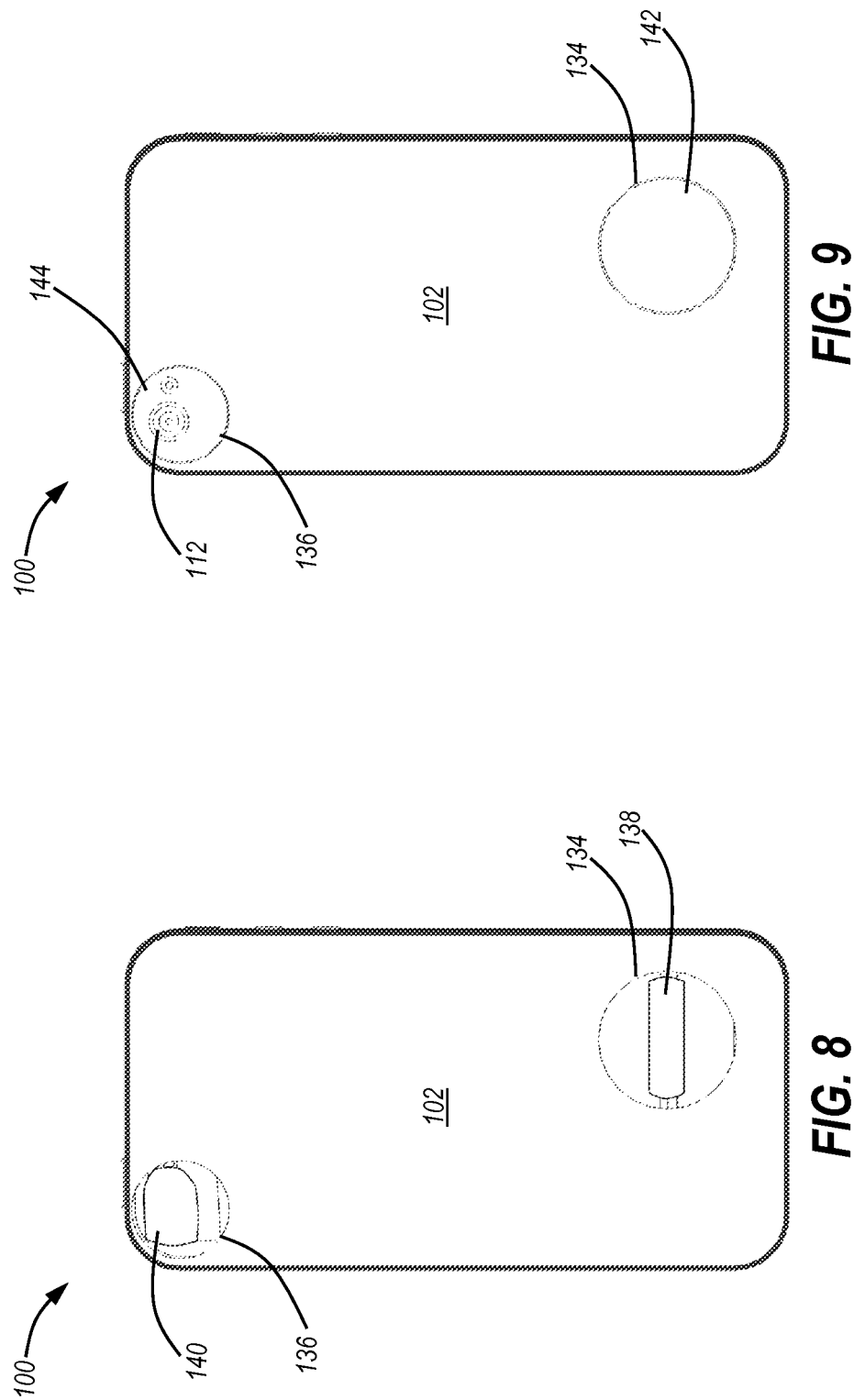

METHODS FOR APPLYING PROTECTIVE COATINGS TO INTERNAL SURFACES OF FULLY ASSEMBLED ELECTRONIC DEVICES

CROSS-REFERENCE TO RELATED APPLICATION

This application is a continuation of U.S. patent application Ser. No. 13/920,836, filed on Jun. 18, 2013 and titled SYSTEMS AND METHODS FOR APPLYING PROTECTIVE COATINGS TO INTERNAL SURFACES OF FULLY ASSEMBLED ELECTRONIC DEVICES ("the '836 application"), which includes a claim for the benefit of priority under 35 U.S.C. §119(e) to the Jun. 18, 2012 filing date of U.S. Provisional Patent Application 61/660,815, titled SYSTEMS AND METHODS FOR APPLYING WATER-RESISTANT COATINGS TO INTERIOR COMPONENTS OF ELECTRONIC DEVICES, ("the '815 Provisional Application"). The entire disclosures of the '815 Provisional Application and the '836 application are, by this reference, incorporated herein.

TECHNICAL FIELD

This disclosure relates generally to systems and methods in which protective coatings are applied to surfaces of the interior components of electronic devices, including portable consumer electronic devices that have been fully assembled, or are in a consumer-ready, or "aftermarket," form. More particularly, aspects of this disclosure relate to systems and methods for forming protective coatings, such as moisture resistant coatings, on interior surfaces and components of electronic devices that have been fully assembled by introducing a protective coating material into the interiors of the electronic devices or accessing the interiors of the electronic devices (e.g., by disassembling the electronic devices, etc.), introducing material of the protective coating onto surfaces that are or will be located within interiors of the electronic devices and, optionally, reassembling the electronic devices.

BACKGROUND

With the increased development of semiconductor technology, electronic devices have played an important role in modern equipment, including mobile phones, digital cameras, computers, and the like. For example, mobile phones have become important equipment in the lives of an office worker, particularly with the advent of so-called smart phones which allow a person to not only make and receive phone calls, but also to view and create calendar events, receive emails, view and edit documents, and the like. Mobile phones and other portable devices are also used outside of an office setting and it is estimated that nearly 475 million smart phones were produced in 2011, and by the end of 2015 that number is expected to double and approach one billion per year.

As the portability and use of portable devices has increased, so has the likelihood that the devices may be damaged. For instance, when carrying a smart phone, laptop, e-reader, digital camera, tablet computing device, and the like, the electronic device may be exposed to water from rain or other environmental conditions, or the device may accidentally be dropped into a puddle, sink, toilet, or other location where water is present. Although some devices may have removable covers on their respective exteriors, the removable covers often do not offer full protection against water. As a result, when the electronic device is exposed to water, the water can leak into the device and damage electronic components within the electronic device.

Exposure of interior electronic components of an electronic device to water or other moisture can also void the warranty of an electronic device. If the warranty is voided and the moisture causes the electronic device to malfunction, the user may have little choice but to expend significant sums to repair or replace the electronic device. As moisture exposure can void the warranty, manufacturers of such devices may have little incentive to provide significant protection against moisture to interior components.

SUMMARY

In accordance with one or more aspects of this disclosure, method and systems are provided for applying protective coatings to surfaces within an interior (e.g., surfaces that are exposed or will be exposed to an interior cavity, etc.) of an electronic device. In various embodiments, the material of the protective coating, which is also referred to herein as a "protective material," may be applied only to interior surfaces of the electronic device to apply, or form, the protective coating. In other embodiments the protective material may be applied to both interior and externally exposed surfaces of the electronic device. The protective material may be applied to a previously fully assembled electronic device as part of a so-called "aftermarket" process. In some embodiments, protective material may simply be introduced into the interior of an electronic device (e.g., through a port, through another opening, etc.). In other embodiments, at least a portion of a body, housing, covering or shroud that defines an exterior of the electronic device and, optionally, encapsulates, contains or otherwise carries one or more components within an interior of the electronic device may be at least partially removed to expose the components, or at least portions thereof, and protective material may be applied to at least some of the newly (and temporarily) exposed interior surfaces of the electronic device. In embodiments where an interior of the electronic device is actively exposed to facilitate the application of protective material to one or more interior surfaces, the interior may be closed (e.g., by reassembly of the body, housing, covering or shroud; by covering or plugging any openings that have been formed; etc.). For the sake of simplicity, the term "housing" and its variants, as used herein, refer to any of the features that form part or all of the exterior of an electronic device.

In some embodiments, the application of protective material to an electronic device, including one or more of its interior surfaces, may comprise part of a method for refurbishing and/or remanufacturing electronic devices, including portable consumer electronic devices and, thus, may be performed by a system for refurbishing and remanufacturing electronic devices.

The protective materials applied to surfaces of an electronic device may impart at least a portion of the electronic device with moisture resistance. As used herein, the term "protective coating" includes moisture resistant coatings or films, as well as other coatings or films that protect various parts of an electronic assembly from moisture and/or other external influences. While the term "moisture resistant coating" is used throughout this disclosure, in many, if not all, circumstances, a moisture resistant coating may comprise or be substituted with a protective coating that protects coated components and/or features from other external influences.

The term "moisture resistant" refers to the ability of a coating to prevent exposure of a coated element or feature to moisture. A moisture resistant coating may resist wetting or penetration by one or more types of moisture, or it may be impermeable or substantially impermeable to one or more types of moisture. A moisture resistant coating may repel one or more types of moisture. In some embodiments, a moisture resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.), wetness, etc. Use of the term "moisture resistant" to modify the term "coating" should not be considered to limit the scope of materials from which the coating protects one or more components of an electronic device. The term "moisture resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components.

Protective coatings may be non-selectively applied to, or formed on, surfaces of an electronic device (e.g., "blanket coated" onto all surfaces that are exposed to a protective material), or the protective coating may be applied to, or formed on, selected portions of one or more surfaces of the electronic device that are exposed to the protective material. Protective material may be applied to, and protective coatings may be applied to, or formed on, one or more surfaces of an electronic device using any of a variety of different types of equipment. Without limitation, a protective material may be applied to one or more surfaces of an electronic device using chemical vapor deposition (CVD), plasma-based deposition processes (including, but not limited to, plasma enhanced CVD (PECVD) processes), physical vapor deposition (PVD) or physical application (e.g., by spraying, rolling, printing, etc.) of the protective material.

Selective application of protective material to an electronic device may include placing a mask or coating release element on one or more portions of the exposed surfaces of the electronic device. A coating release element (e.g., a material that prevents adhesion of a mask material or protective coating to a surface that has been coated with the material, or coating release element; etc.) and/or a mask may be placed on one or more surfaces (e.g., a port, an electrical contact, a lens, a speaker, a microphone, a peripheral surface, etc.). When the mask is applied, the coating may be applied to the mask rather than to the surface beneath the mask. The mask and any portion of the protective coating thereon may then be removed to expose the underlying surface of the electronic device. In some cases, the underlying surface may be exposed to enable electrical contact or communication during reassembly and/or use of the electronic device. In other embodiments, one or more portions of a protective coating may be selectively removed from one or more features of the electronic device by suitable means. Such means for removing a portion of the protective coating may ablate, dissolve, vaporize, mechanically remove or otherwise take protective material away from each selected region of the protective coating.

In embodiments where at least a portion of a housing, covering or shroud is removed to at least partially expose an interior of an electronic device, the act of removal may comprise at least partial disassembly of the electronic device. Disassembly of an electronic device may occur in a variety of different ways, and may vary from one type of electronic device to the next. In some embodiments, one or more portions of a housing may be disassembled or separated from one or more other portions of the housing to expose at least a portion of an interior of the electronic device. Once the interior of the electronic device has been at least partially exposed, a protective coating may be applied to interior surfaces of one or more portions of the housing and/or to features or surfaces within the interior of the electronic device. In some embodiments, disassembly of an electronic device may include removal or separation of components other than, or in addition to, the housing, including separation of a power supply (e.g., a battery, etc.), a circuit board, a semiconductor device (e.g., a processor, a memory device, etc.), or another component from a remainder of the electronic device. A protective coating may be applied to the remainder of the electronic device assembly, to one or more of the components that have been removed from the electronic device (e.g., collectively, or to any or all components in isolation, etc.) or to any suitable combination of components.

As indicated, at least a portion of the housing of an electronic device may be configured for selective separation from one or more other portions of the housing or from a remainder of the electronic device, or the housing may not include any feature that provides ready access to an interior of the electronic device (e.g., the entire housing may permanently house other components of the electronic device, etc.). In embodiments where the housing of an electronic device is not configured for ready removal and does not include any features that provide ready access to the interior of the electronic device, it may be difficult to access the interior of the electronic device or to separate the electronic device into multiple components. Some embodiments, therefore, include cutting or otherwise removing a portion of the housing of an electronic device to form access locations through which components or features within an interior of the electronic device may be accessed. Access locations in the housing may provide access to desired locations (e.g., features, components, surfaces, etc.) within the interior of an electronic device and, in some embodiments, access locations may correspond to locations within the electronic device through which various features or components can be removed, masked, or treated (e.g., to prevent adhesion of a protective coating, to enable removal of a mask material and/or protective material, etc.). In some embodiments, access locations may correspond to locations where a protective material will be or has been introduced into the electronic device, and from which the protective material may access and, thus, be applied to one or more surfaces, features or components inside of the electronic device. After use of an access location is complete, a plug, cap or cover may be formed or assembled with the electronic device to close each access location and, thus, to limit the exposure of surfaces, features or components within the electronic device to an environment outside of the electronic device.

According to some embodiments, components of a disassembled electronic device may, prior to application of a protective coating, lack water-resistant or other protective features. In other embodiments, a disassembled electronic device may include one or more mechanical seals (e.g., O-rings, gaskets, etc.) that are configured to prevent moisture from entering into the housing of the electronic device. In still other embodiments, the disassembled components may include a protective material which is the same as or different from (e.g., in material, texture, purpose, or other characteristics) the protective coating applied using the methods and systems of this disclosure. Where a protective coating of some sort is in place upon at least some surfaces of an electronic device prior to application of a protective coating in accordance with teachings of this disclosure (e.g., prior to accessing at least a portion of the electronic device, etc.), subsequent application of a protective coating in accordance with teachings of this disclosure may produce a discernible boundary or seam between adjacent protective coatings, with the subsequently applied, aftermarket protective coating being located at the same elevation as the original protective coating, at a more outward elevation than the original protective coating or, in some embodiments, at least partially superimposed over the original protective coating.

Various embodiments of systems for applying protective coatings are also disclosed. Such a system may include components of a production line (e.g., a manufacturing line, an assembly line, etc.) in which processes or elements thereof are performed manually or are automated, or a system may be configured to perform a combination of manual and automated actions. An example of such a system may include an access element, which is also referred to as a disassembly element, for providing access to at least a portion of an interior of an electronic device (e.g., disassembling the electronic device, opening the electronic device, etc.). The disassembly element may be configured to separate one or more portions of a housing from one or more other portions of a housing, or from other components of the electronic device (e.g., a remainder of the electronic device, etc.), to cut into the housing, to remove or provide access to one or more features or components within an interior of the electronic device, or to perform any combination of these actions. Once interior features or components are accessible or exposed, a coating element of the system may apply a protective coating. Thereafter, a sealing element may limit access to the interior of the electronic device (e.g., by reassembling the electronic device or otherwise closing it, etc.) to enable resumed operation and use of the electronic device.

Embodiments of a coating application system may also include a selectivity element. The selectivity element may apply a coating release element and/or a mask to selected portions (e.g., features, components, etc.) of an electronic device or an electronic device assembly, etc.) to prevent or inhibit a protective coating from being applied to, or to enable the ready removal of a protective coating from, one or more surfaces of the electronic device. The selectivity element may be located upstream from the coating element. Additionally, an optional material removal element may be located downstream from the coating element to optionally remove a mask and/or one or more portions of a protective coating.

Other aspects, as well as features and advantages of various aspects, of the disclosed subject matter will become apparent to those of skill in the art through consideration of the ensuing description, the accompanying drawings and the appended claims.

BRIEF DESCRIPTION OF THE DRAWINGS

In the drawings:

FIG. 6 is a rear view of the electronic device of FIG. 1;

FIG. 7 illustrates the electronic device of FIG. 6 with holes formed through a housing of the electronic device to expose interior features or components of the electronic device;

FIG. 8 illustrates the electronic device of FIGS. 6 and 7, with masking elements applied to interior features or components;

FIG. 9 illustrates the electronic device of FIGS. 6-8 and includes covers for the openings through the housing of the electronic device.

DETAILED DESCRIPTION

A system for applying protective coatings to electronic devices may include one or more coating elements. Each coating element of such a system is configured to apply a protective coating to surfaces of one or more internal features or components of an electronic device. The protective coating may be configured to prevent electrical shorting and/or corrosion of one or more features or components of the electronic device. Although protective coatings may be referred to herein as being "water-resistant" or providing "water resistance," the protective coatings disclosed hereby are not limited to coatings that provide protection against moisture and/or its effects (e.g., electrical shorting, corrosion, etc.).

When an electronic device is fully assembled, the electronic device may be susceptible to penetration by moisture. In some cases, the material from which a housing of the electronic device is made may be porous or otherwise allow moisture to penetrate it if it is exposed to moisture for a sufficient period of time. In the same or other embodiments, different segments of a housing or shell may mate or connect together. A seam may exist at the junction between different components, and the seam may be susceptible to penetration by water or another fluid. A covering or coating material may be applied to the exterior of the electronic device to resist or prevent penetration of water through the housing material or seams therein. Aspects of the present disclosure also relate to applying protective coatings to components located within, or in the interiors of, electronic devices. In some cases, the protective coating can be applied to individual features, components or subassemblies prior to their assembly or reassembly with other parts of the electronic device. In other embodiments, however, the coating may be applied collectively or individually to multiple elements or components of a previously assembled electronic device.

Figure 1:
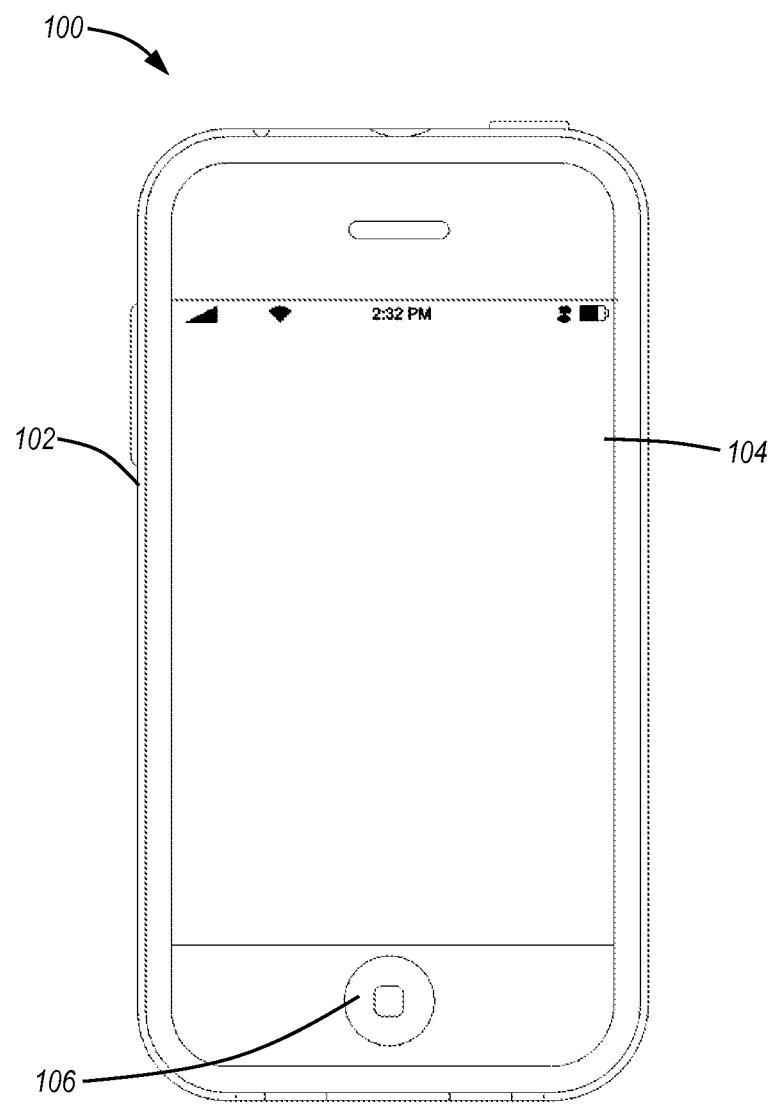
FIG. 1 illustrates an embodiment of an electronic device.

FIG. 1 depicts an embodiment of an electronic device 100 that may have a protective covering applied thereto. The illustrated electronic device may include a housing 102. The housing 102 can be configured to secure (e.g., encase, enclose, carry, etc.) and/or protect one or more interior components (not shown). Such interior components may include processors, storage media, transceivers, power supplies, circuitry, antennas, audio transducers (e.g., speakers, microphones, etc.), and other components that generally enable the electronic device 100 to operate in a desired manner. In the illustrated embodiment, the electronic device 100 may display text or visual (e.g., pictorial or video) information to a user. The information may be presented on a display 104. Optionally, a user interface 106 is included to allow a user to interact with the electronic device 100. The user interface 106 may be accessible through the housing 102 (e.g., formed in the housing 102, embedded in the housing 102, otherwise be secured to the housing 102, etc.). In some embodiments, the display 104 may also include user interface features. For instance, the display 104 may comprise a touch screen using pressure, capacitive, or other input features to enable a user to select one or more options or otherwise provide an input.

The depicted electronic device 100 is generally illustrative of a number of different types of electronic devices that may have protective materials and coatings applied thereto. For instance, the electronic device 100 may represent any electronic device that may be intentionally or accidentally placed in an environment where it may be exposed to moisture. The electronic device 100 may be portable or relatively non-portable. Examples of portable electronic devices include, but are not limited to, smart phones, handheld multimedia devices (or "digital media players"), socalled "slate" or "tablet" computers, e-readers, inventory scanners or the like. Examples of smart phones may include, but are certainly not limited to, the IPHONE® devices available from Apple, Inc. and the GALAXY™ devices available from Samsung Electronics Co., Ltd. Some nonlimiting examples of multimedia devices include the IPOD® and IPOD TOUCH® devices available from Apple, Inc. and any number of additional devices from various manufacturers and having different capabilities. A few examples of "slate" or "tablet" computers include, but are not limited to, the IPAD® products available from Apple, Inc., the XOOM™ tablet computer available from Motorola Mobility, Inc., the BLACKBERRY PLAYBOOK™ available from Research in Motion Limited, the STREAK™ available from Dell Inc., the HP TOUCHPAD™ available from Hewlett-Packard Co., and the GALAXY TAB™ available from Samsung Electronics Co., Ltd. The KINDLE® devices available from Amazon Technologies, Inc. and the NOOK™ devices available from Barnes & Noble, Inc., are examples of e-readers. Of course, a protective coating may also be applied to any of a wide variety of other types of electronic devices, such as laptop computers, desktop computers, monitors, televisions, optical disk players, storage devices, garage door openers, remote keyless entry systems (e.g., automotive keys, etc.) or any other electronic devices intended for general or specific uses.

Regardless of the specific type or purpose of electronic device 100, the electronic device 100 may be protected by one or more protective coatings. Example methods for protecting the electronic device 100 are described in additional detail with respect to the figures following FIG. 1.

The housing 102 of the electronic device 100 may generally carry and/or protect one or more components or features of the electronic device 100, including, without limitation, one or more components or features that are inside the electronic device 100. In some embodiments, the coated components or features may generally enable operation of the electronic device 100.

Figure 2:
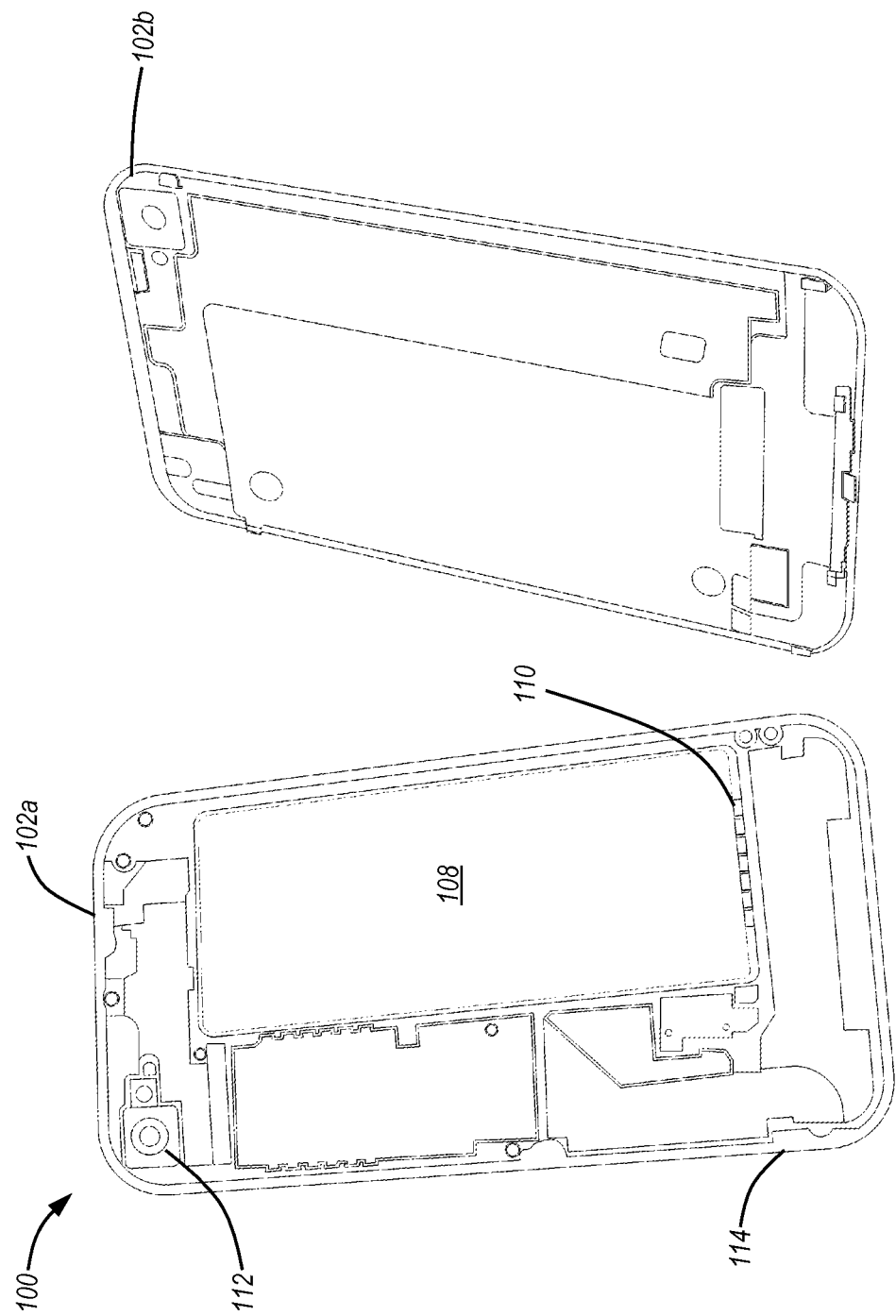
FIG. 2 illustrates the electronic device of FIG. 1 following its disassembly into front and rear portions.

The housing 102 may generally be constructed to protect the sensitive internal features or components of the electronic device 100 from damage by physical impact or exposure to water, dust or other elements or contaminants. In this regard, the housing 102 may provide some level of protection against the elements and contaminants by preventing exposure of the internal features or components to the elements or contaminants that might otherwise damage, disable or interfere with the operation of the internal features or components. While the housing 102 may provide some protection, it may not be configured to entirely prevent the elements or contaminants from contacting the internal features or components of the electronic device 100. For instance, the housing 102 may include one or more ports (e.g., ports to connect audio devices, power supplies, communication elements, etc.) that provide passageways from the exterior of the electronic device 100 to its interior. Boundaries or interfaces between two or more assembled parts (e.g., at seams between assembled parts of the housing 102, between the housing 102 and the display 104, between the housing 102 and a user interface 106; e.g., a button (e.g., a power button, a volume button, etc.), a switch, and other components (e.g., speakers, camera lenses, microphones, etc.) may also provide potential paths through which the elements or contaminants from outside of the electronic device 100 may reach its interior. Regardless of the potential paths by which the elements or contaminants can enter the housing 102 and, thus, reach features or components within the electronic device 100, some of the internal features or components could potentially be damaged, disabled or have their operation interfered with if the exposure is significant enough.

Where the housing 102 includes multiple parts or pieces, one or more of the parts or pieces of the housing 102 may be disassembled from another part or piece of the housing 102 to expose the internal features or components of the electronic device 100. FIG. 2, for instance, illustrates an embodiment in which parts or pieces of the housing 102, including a front portion 102a and a rear portion 102b, have been separated from one another. Disassembly of the housing 102 may be performed in any suitable manner. For instance, the electronic device 100 may be designed to allow a user to easily separate the front and rear portions 102a, 102b of the housing 102. By way of illustration, the rear portion 102b may be removable and selectively secured to the front portion 102a using snap fit or frictional fit components, latches, screws, or other suitable means for securing.

In other embodiments, the rear portion 102b of the housing 102 may not be configured for removal from another assembled part or piece of the housing 102a. For instance, one or more means for securing (e.g., rivets, welds, etc.) may be used to fasten portions 102a, 102b of the housing 102 together. In such embodiments, the means for securing may be overcome by cutting, drilling, or the like, enabling adjacent parts or pieces of the housing 102 (e.g., the front and rear portions 102a and 102b, etc.) to be separated from one another.

As shown in FIG. 2, when the adjacent parts or pieces of the housing 102 (e.g., front and rear portions 102a and 102b, etc.) are separated—regardless of the particular manner in which separation occurs—various internal features and/or components of the electronic device may be exposed and visible. By way of illustration, in the depicted embodiment, a power supply 108, such as a battery, may be seen. The power supply 108 may include contacts that touch one or more corresponding contacts 110 of the electronic device 100, which are generally located within the housing 102. The power supply 108 and contacts 110 are merely illustrative of different internal features and components within the housing 102 of an electronic device 100. Additional components, for instance, may include circuits and circuit boards, wiring, processors, storage media and devices, communication busses, speakers, microphones, and any number of additional devices or components. Some or all of such components may be susceptible to damage or malfunction if exposed to certain conditions, such as the elements, moisture or contaminants.

Figure 3A:
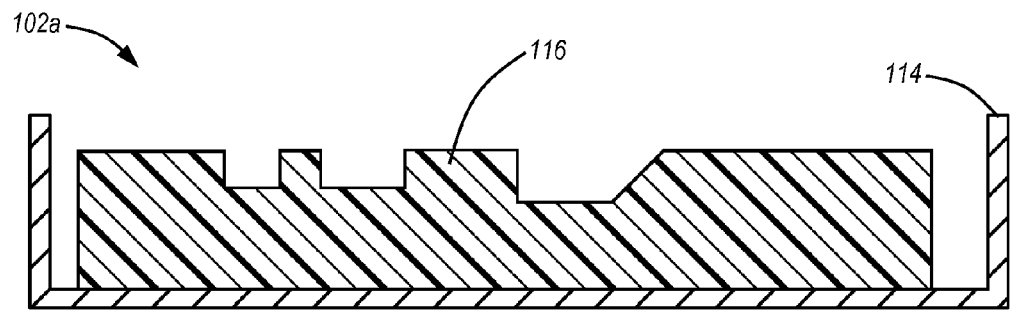
FIG. 3A is a schematic representation of a front portion of the disassembled electronic device of FIG. 2.

FIG. 3A is a schematic, cross-sectional representation of the front portion 102a of the electronic device 100 shown in FIG. 2. In FIG. 3A, an internal component 116 is illustrated as being located within an outer periphery 114 defined by the front portion 102a, and may be fully encased when the rear portion 102b (see FIG. 2) of the housing 102 of the electronic device 100 is attached to the front portion 102a. The internal component 116, as depicted, may correspond generally to any individual internal components of the electronic device 100, including internal components that are at least partially carried by the front portion 102a of the housing 102, and may also represent all internal components collectively within the front portion 102a of the housing 102 or even all internal components of the electronic device 100.

Figure 3B:
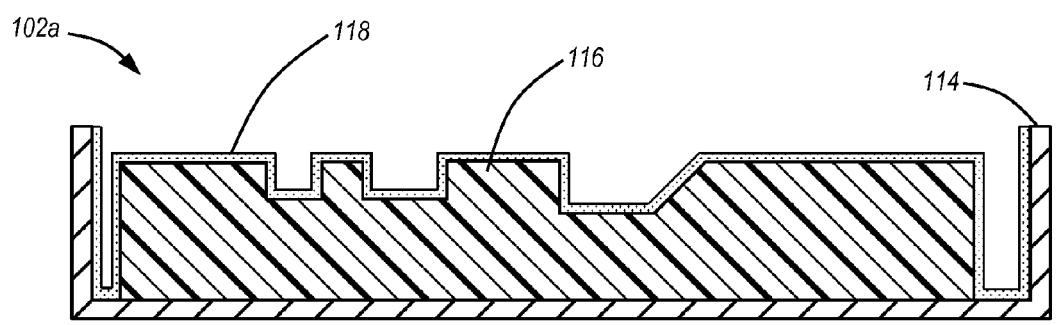
FIG. 3B is a schematic representation of the front portion of the disassembled electronic device of FIGS. 2 and 3A, with a protective coating applied to the front portion.

The internal component(s) 116 and, optionally, all or any portion (e.g., the internal surface(s), etc.) of the front portion 102a of the housing 102 of the electronic device 100 may be coated with a protective material. The protective material may take any number of different forms; in one embodiment it comprises a protective coating to protect the internal component 116 from exposure to moisture. FIG. 3B illustrates an embodiment in which a protective coating 118 is applied to (e.g., deposited or otherwise placed on) the internal component 116. In some embodiments, the protective coating 118 may also be applied to portions of the housing 102, including up to, and potentially extending beyond, the outer periphery 114 of the front portion 102a of the housing 102, or a boundary between an outer surface and an inner surface of the front portion 102a.

The protective coating 118 may comprise any of, or any combination of, a variety of embodiments of coatings. In some embodiments, the protective coating 118 may comprise a water-resistant material. In a specific embodiment, the protective coating 118 may be formed with a reactive monomer that reacts with other monomers or reactive groups at an end of a polymer chain to form polymers. In specific embodiments, the protective coating 118 may include poly(p-xylylene) (i.e., Parylene), including unsubstituted and/or substituted units (or -mers). In some embodiments, the protective coating 118 may comprise a film having a sufficient thickness to provide a desired level of moisture resistance. In various embodiments, the protective coating 118 may have a minimum thickness or an average thickness of at least one micrometer, or micron (μm) (e.g., about 4 μm, about 5 μm, about 7 μm, about 8 μm, etc.).

The extent to which a protective coating limits exposure of a coated feature or component to moisture may be quantified in any number of different manners, and using a variety of different metrics. For example, the ability of a protective coating to physically inhibit water from contacting a coated feature or component may be considered to impart the coating with water resistance. In other embodiments, the water resistance of a protective coating may be based on more quantifiable data. As an illustration, water resistance may be measured as the rate at which water permeates through the material of the protective coating, or using a water vapor transfer rate (WVTR). In the case of a water vapor transfer rate, the rate may be measured using any suitable technique. Such a measurement may measure water in units of $g/m^2/day$ or in units of $g/100\ in^2/day$ (e.g., less than 2 $g/100\ in^2/day$, about 1.5 $g/100\ in^2/day$ or less, about 1 $g/100\ in^2/day$ or less, about 0.5 $g/100\ in^2/day$ or less, about 0.25 $g/100\ in^2/day$ or less, about 0.15 $g/100\ in^2/day$ or less, etc., through a film at a temperature of 37° and at a relative humidity of 90%).

Alternatively, or in addition, the protective coating 118 may comprise a hydrophobic, or water repellant, material. In various embodiments, such a material may comprise a fluorinated organic polymer. A specific but nonlimiting embodiment of such a material is 1H,1H,2H,2H-Heptadecafluorodecyl acrylate.

The hydrophobicity, or water repellence, of a protective coating 118 may be determined through use of a water contact angle when water is applied to a surface of the coating by an acceptable technique (e.g., the static sessile drop method, the dynamic sessile drop method, the dynamic Wilhelmy method, the single-fiber Wilhelmy method, the powder contact angle method, etc.). The hydrophobicity of the surface may be measured by determining the angle the base of a water droplet makes with the surface, from beneath a base of the water droplet. As an example, the Young equation may be used. The Young equation may be stated as:

$$\theta_C = \arccos \frac{r_A \cos\theta_A + r_R \cos\theta_R}{r_A + r_R},$$

where $\theta_A$ is the highest, or advancing, contact angle and $\theta_R$ is the lowest, or receding, contact angle. The values of $r_A$ and $r_R$ may be determined using the following equations:

$$r_A = \sqrt[3]{\frac{\sin^3\theta_A}{2 - 3\cos\theta_A + \cos^3\theta_A}}; \text{ and}$$

$$r_R = \sqrt[3]{\frac{\sin^3\theta_R}{2 - 3\cos\theta_R + \cos^3\theta_R}}$$

A surface that has an affinity for water, or which absorbs water, is generally known as a "hydrophilic" surface. If the surface is hydrophilic, the water will spread somewhat, forming a water contact angle of less than 90° with the surface. In contrast, a hydrophobic surface, which, for purposes of this disclosure, may be considered to be moisture resistant, will prevent or restrict the water or other liquid from spreading, resulting in a water contact angle of 90° or greater. In general, the more the water beads on a surface, the greater the water contact angle and the greater the hydrophobicity. When water droplets bead on a surface such that the water contact angle with the surface is about 120° or more, the surface may be considered to be highly hydrophobic. When the angle at which water contacts a surface exceeds 150° (i.e., a water droplet on the surface is nearly spherical), the surface is said to be "superhydrophobic." The foregoing is illustrative only, and other measures of protection, including water resistance, may be employed to characterize a protective coating (e.g., a protective coating formed in accordance with teachings of this disclosure, etc.).

Other materials from which a protective coating 118 may be formed include, but are not limited to, thermoplastic materials, curable materials (e.g., radiation-curable materials, two-part materials, thermoset materials, room temperature curable materials, etc.).

The material used for a protective coating 118 may be applied in numerous manners, examples of which are described by U.S. Patent Application Publication Nos. 2009/0263581, 2009/0263641 and 2011/0262740, the entire disclosures of each of which are, by this reference, incorporated herein. U.S. Patent Application Publication Nos. 2009/0304549, 2010/0203347, and 2010/0293812, the entire disclosures of which are also incorporated herein by this reference, disclose embodiments of equipment and/or processes that may be employed to apply a protective coating 118. Some non-limiting examples of equipment that may be used to apply a protective coating 118 include molecular diffusion equipment, chemical vapor deposition (CVD) equipment, physical vapor deposition (PVD) equipment (e.g., devices that employ evaporation deposition processes (including, but not limited to e-beam evaporation), sputtering, laser ablation, pulsed laser deposition, etc.) and physical application apparatuses (e.g., printing equipment, spray-on equipment, roll-on equipment, brush-on apparatuses, etc.). Of course, other types of equipment may be used to apply a protective coating 118 to one or more features or components of an electronic device 100.

In the context of the protective coating 118 illustrated by FIG. 3B, a single material or multiple materials may be used to form the protective coating 118. In some embodiments, different types of protective coatings 118 may be used together to provide desired types of protection to a coated feature or component. Without limitation, a protective coating 118 may be configured to provide a moisture impermeable coating, while another protective coating 118 material may be moisture-repellant, and yet another protective coating 118 comprises an anti-static coating and another protective coating 118 may provide an adhesive function. Other types of protective coatings 118 may also be used. In some embodiments, a protective coating 118 may include two or more sublayers that provide different types of protection. Alternatively, different types of protective coatings 118 may be applied to different features or components (e.g., moisture-repellant protective coatings 118 may cover features that might not function as intended if coated with a moisture impermeable protective coating 118, while less sensitive features may carry relatively robust moisture impermeable protective coatings 118, etc.).

In the embodiment depicted by FIG. 3B, a protective coating 118 may cover all or substantially all the interior surfaces of an electronic device 100 (FIGS. 1 and 2) (e.g., a portion enclosed in a front portion 102a of the housing 102 (FIG. 2)), without covering exterior surfaces of the electronic device 100 or its housing 102. It should be appreciated that the embodiment illustrated by FIG. 3B is not limiting. In some embodiments, the protective coating 118 may be applied to at least some surfaces, features or components that are exposed to an exterior of the electronic device. A protective coating 118 may be applied to, or may reside on, fewer than all of the interior surfaces of an electronic device 100; i.e., some surfaces within the interior of the electronic device 100 may be exposed through apertures in the protective coating 118 and/or laterally beyond an outer periphery of the protective coating.

Figure 4:
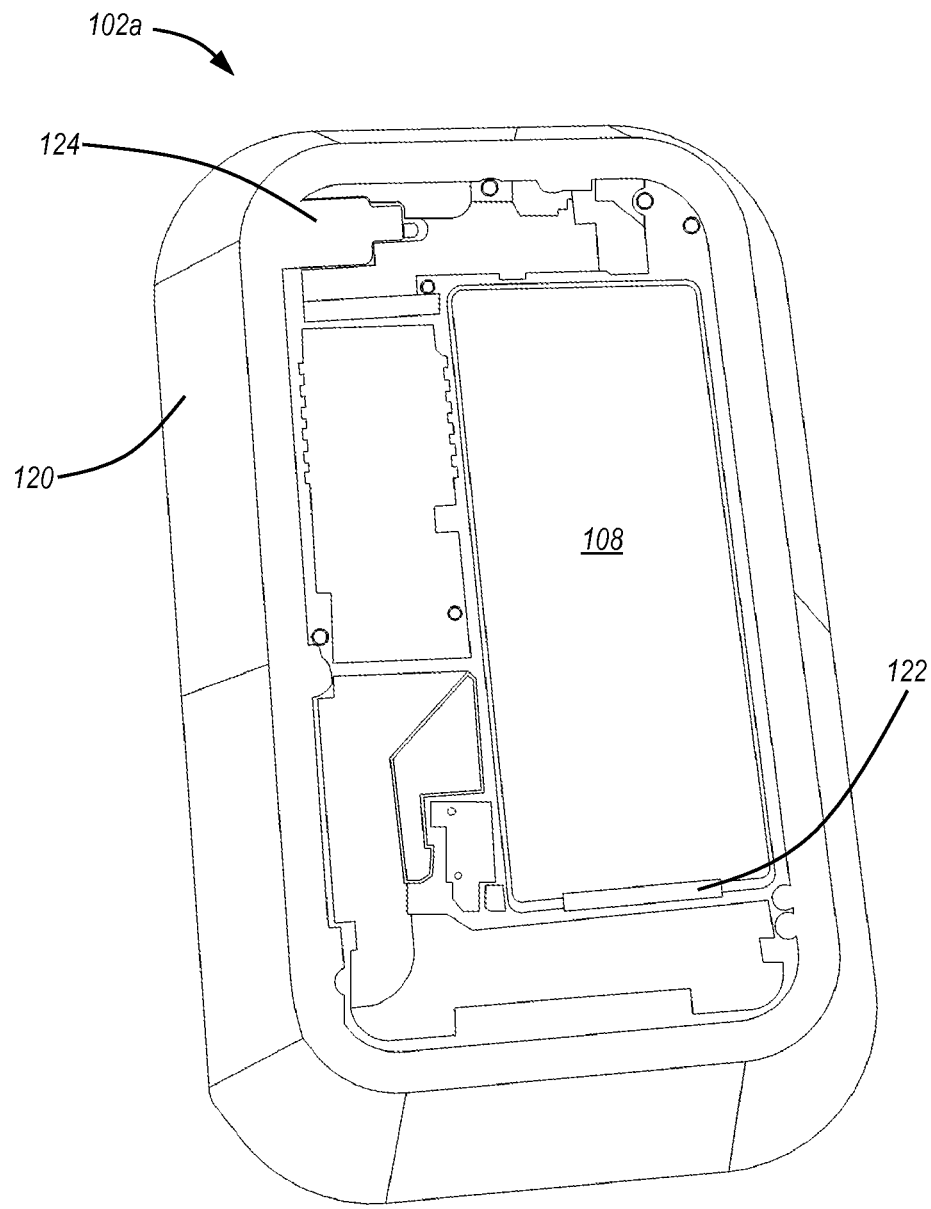
FIG. 4 illustrates the front portion of the disassembled portable electronic device of FIG. 2, with elements of a mask applied thereto.

FIG. 4 illustrates an embodiment of a technique for restricting the application of a protective coating 118 (FIG. 3B) to one or more selected areas, features or components of an electronic device 100 (FIGS. 1 and 2). Such selectivity may be achieved by way of one or more masks 120-124 or coating release elements, which may be applied to areas, features and/or components that are not to be covered by a protective coating 118.

Any suitable configuration of mask 120-124 or other coating release elements may be used (e.g., a preformed mask configured for assembly with a substrate; a mask formed on a substrate; a coating release material, such as a non-stick material, an oil, a grease or the like; etc.). The masks 120-124 or other coating release elements may comprise (a) material(s) that can be secured (e.g., adhered, etc.) to a surface that is to remain exposed through or laterally beyond a protective coating 118 (FIG. 3B), while withstanding the processes by which the materials from which such a protective coating 118 is formed.

The masks 120-124 or other coating release elements may be configured to prevent the application of a protective coating 118 to locations covered by the masks 120-124 or coating release elements (e.g., they may be formed from a material that prevents application of a protective coating 118 to the masks 120-124, they may have a surface configured to prevent application of a protective coating 118 thereto, etc.). Alternatively, portions of a protective coating 118 may be applied to the masks 120-124 or coating release elements, but the masks 120-124 or coating release elements may be configured to facilitate or enable the removal of any portions of the protective coating 118 thereover (e.g., by so-called "lift-off" techniques; by defining areas where adhesion of the protective coating 118 to a portion of the electronic device 100 is reduced, and delineating one or more boundaries at which the protective coating 118 may be cut or otherwise disrupted to enable removal of one or more portions that overlie a mask 120-124 or coating release element; etc.). A mask 120-124 or coating release element may be formed from a material that may be removed (e.g., chemically, thermally, etc.) with selectivity over a material of the protective coating 118. In some embodiments, including those where a mask 120-124 or coating release element is applied to an electrical contact or the like, the mask 120-124 or coating release element may be configured to remain in place after a protective coating 118 is applied to an electronic device 100 (e.g., it may comprise a conductive material, solder flux, a material that facilitates electrical coupling to the masked feature, etc.).

In the specific, but non-limiting embodiment depicted by FIG. 4, a first mask 120 or coating release element is positioned around the perimeter or outer periphery 114 (FIGS. 2-3B) of the front portion 102a of a housing 102 (FIG. 1), and extends outward to cover the exterior of the front portion 102a. Thus, the mask 120 or coating release element may be configured to prevent application of a protective coating 118 (FIG. 3B) to the exterior surface of the front portion 102a, and to prevent the material(s) from which the protective coating 118 is formed from blocking ports or other access features of the electronic device 100 (FIGS. 1 and 2).

In FIG. 4, a second mask 122 or coating release element is shown at a location adjacent to an end of a power supply 108, such as a removable, rechargeable battery, where the mask element 122 or coating release element may shield one or more contacts 110 (FIG. 2) through which the power supply 108 electrically couples to the electronic device 100 (FIGS. 1 and 2).

In addition, the subassembly illustrated by FIG. 4 includes a third mask 124 or coating release element that resides over a camera lens and/or flash element 112 (FIG. 2) (i.e., a source of bright light).

The masks 120-124 or coating release element are merely illustrative; masks 120-124 or coating release elements may be applied to any number of different locations or to different types of features or components of a substrate, such as an electronic device 100 (FIGS. 1 and 2). A few examples of locations where masks 120-124 or coating release elements may be applied include audio transducers, or input/output devices, electrical contacts, moving parts (or at least portions thereof), optical components, and the like.

Figure 5A:
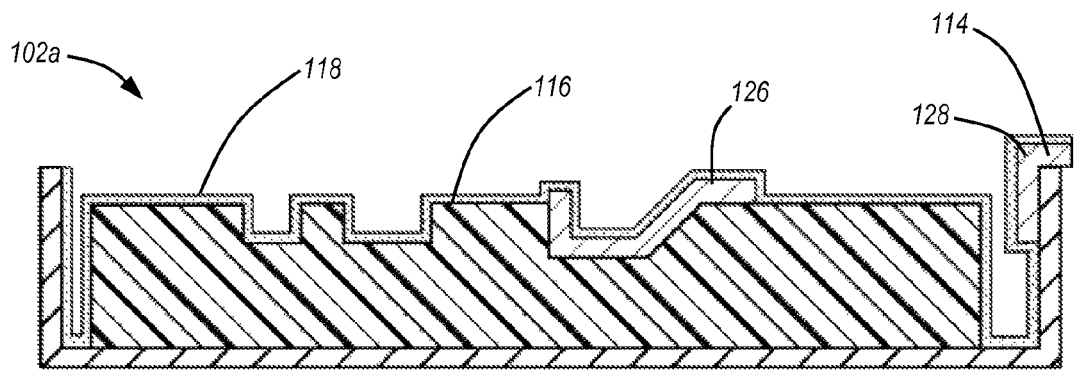
FIG. 5A is a schematic cross-sectional representation of the front portion of the disassembled portable electronic device of FIG. 4, with a mask and a protective coating applied thereto.

FIG. 5A illustrates an embodiment of a masking process in additional detail. In particular, FIG. 5A is a schematic representation of the front portion 102a (FIG. 4) of the housing 102 (FIG. 1), and includes an internal component 116 at least partially enclosed within the housing 102 or secured to the housing 102. As discussed herein with respect to FIGS. 3A and 3B, the internal component 116 may comprise a single feature or component that is substantially confined within the housing 102 when the electronic device 100 (FIGS. 1 and 2) is in an assembled state, or the internal component 116 may collectively represent multiple internal components of the electronic device 100.

Figure 5B:
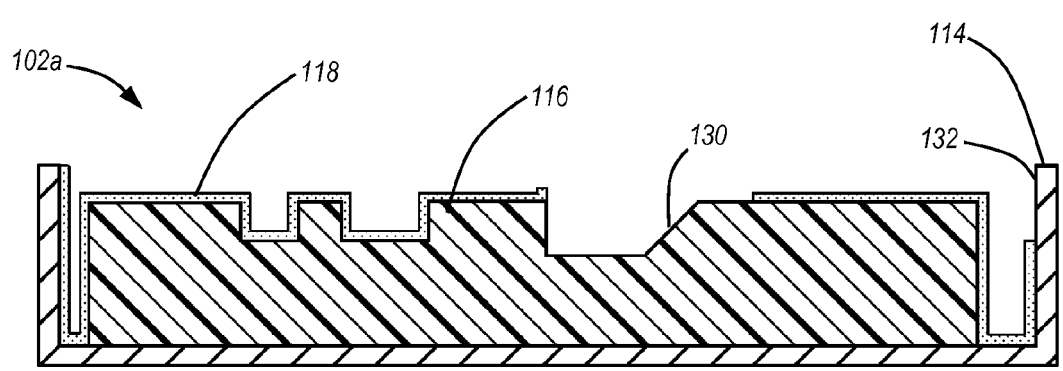
FIG. 5B is a schematic cross-sectional representation of the front portion of the disassembled portable electronic device of FIG. 5A, with masking elements removed therefrom.

As shown in FIG. 5A, two masks 126, 128 or coating release elements may be applied to portions of the internal component 116 and/or the front portion 102a of the housing 102 (FIG. 1). In particular, a first mask 126 or coating release element is applied to a surface (or to multiple surfaces) of the internal component 116 while a second mask 128 or coating release element is applied to a portion of the outer periphery 114 of the front portion 102a. In the illustrated embodiment, when the protective coating 118 is applied to the illustrated portion of the electronic device 100 (FIGS. 1 and 2), the protective coating 118 resides on (e.g., adheres to, etc.) the outer surfaces of the masks 126 and 128 or coating release elements rather than to surfaces that are covered by the interior surfaces of the masks 126 and 128 or coating release elements. Thereafter, the masks 126 and 128 or coating release elements may optionally be removed. As shown in FIG. 5B, the removed masks 126 and 128 or coating release elements (FIG. 5A) may enable a surface 130 of the internal component 116, as well as one or more surfaces 132 of the outer periphery 114 of the front portion 102a of the housing 102 (FIG. 1) to lack a protective coating 118; i.e., to be exposed through an aperture of a protective coating 118 or laterally beyond a protective coating 118.

As discussed herein, a protective coating 118 (FIGS. 3B, 5A, 5B) may provide protection to features and/or components of an electronic device 100 (FIGS. 1 and 2). Once one or more protective coatings 118 have been applied to one or more features or components of an electronic device 100, the electronic device 100 may be reassembled or otherwise be substantially returned to the state in which it was originally provided to a consumer (e.g., by plugging holes, re-engaging coupling features, etc.). Reassembly of an electronic device 100 may include, for instance, reassembling front and rear portions 102a and 102b (see FIG. 2), respectively, of a housing 102 (FIG. 1).

The electronic device 100 shown in FIGS. 2-5B includes a housing 102 that may be readily disassembled into component sections, such as front and rear portions 102a and 102b. It should be appreciated, however, that not all electronic devices are configured for ready disassembly. For instance, specialized equipment or tooling may be required to disassemble an electronic device. In other embodiments, a housing may not be configured for disassembly (e.g., single-use devices, electronic devices provided under exclusive or restrictive service contracts, etc.).

FIGS. 6-9 illustrate an embodiment of a method for accessing the interior of an electronic device 100 and applying one or more protective coatings to internal components of the electronic device 100. The method represented by FIGS. 6-9 may be useful with electronic devices 100 that have housings 102 that are difficult to disassemble or that are not configured for disassembly.

FIG. 6 provides a rear view of an electronic device 100. The electronic device 100 may have ports, user interfaces, seams and/or other features through which moisture, dust, other contaminants or other potentially damaging elements may enter into the interior components of the electronic device 100 and, thus, make the electronic device 100 susceptible to damage. As an example, and not by way of limitation, the electronic device 100 may include a camera lens and/or flash element 112, the housing 102 of the electronic device may include an aperture that accommodates the camera lens and a seam may exist at the interface between the camera lens and/or flash element 112 and the electronic device 100. If the electronic device 100 is exposed to moisture, dust, other contaminants or other potentially damaging elements, the seam between the camera lens and/or flash element 112 and the housing 102 may allow water to enter into the interior of the housing 102 and, thus, into the interior of the electronic device 100.

In such an embodiment, access to the interior of the electronic device 100 may be provided by removing a portion of the housing 102. The configuration of the electronic device (e.g., the locations of features or components within its interior, etc.) may dictate the location(s) at which a protective material may be introduced into the interior of the electronic device. In FIG. 6, for instance, an electronic device 100 with two access locations 134 and 136 is illustrated. Using a cutting, drilling, milling, or other suitable material removal operation, portions of the housing 102 at one or more access locations 134, 136 may be removed to expose an interior of the electronic device 100.

FIG. 7 illustrates the electronic device 100 once portions of the housing 102 at one or more access locations 134, 136 have been removed. In the illustrated embodiment, access location 134 may expose or otherwise provide access to one or more components, such as electrical contacts 110. Another access location 136 may expose or otherwise provide access to a different component, such as a camera and or flash element 112. The number of access locations 134, 136 may correspond, of course, to the different components that may be accessed.

Once the interior of the electronic device 100 has been accessed, the electronic device 100 may optionally be subjected to pre-application processing. Without limitation, pre-application processing may include the removal of contaminants from the electronic device 100 or, as depicted by FIG. 8, processes that enable a protective coating to be selectively applied to features or components of the electronic device 100 (e.g., masking processes, in which masks 138, 140 or coating release elements are placed or formed on features or components that are to ultimately remain uncoated; application of coating release elements to features or components that are not to be covered with a protective coating; etc.). Optionally, all or part of an exterior of the housing 102 of an electronic device 100 may be masked or otherwise treated to prevent a protective coating from being formed or remaining thereon.

With at least a portion of the interior of the electronic device 100 exposed, a protective material may be introduced into the housing 102 or a protective coating may otherwise be applied to one or more features or components within the housing 102.

In embodiments where one or more masks 138, 140 or coating release elements are applied to features or components of the electronic device 100, post-application processing of the electronic device 100 may include removal of each mask 138, 140 or coating release element and any protective coating thereon. Without limitation, removal of an area of protective coating that resides over a mask may comprise cutting (e.g., at or around the periphery of the mask 138, 140 or coating release element, etc.) or a similar process (e.g., scoring, perforating, focused material removal, etc.), along with lifting the protective coating and, if a mask 138, 140 or coating release element was used, lifting the mask 138, 140 or coating release element from the feature or component that it covered. Alternatively, a portion of a protective coating and, in some embodiments, a mask 138, 140 or coating release element beneath that portion of the protective coating may be removed by directed mechanical material removal processes (e.g., use of abrasives, polishing, etc.), directed chemical material removal processes (e.g., etching, dissolution, etc.), directed radiation material removal processes (e.g., lasers, etc.) or the like.

After applying the protective coating, access to the interior of the electronic device 100 may be closed. In FIG. 9, for instance, a plug 142, 144, which may be formed to fit within an access location 134, 136, may be assembled with the housing 102 at its corresponding access location 134, 136. The plug 142, 144 may be secured in place using any suitable mechanism, including, without limitation, a frictional or interference fit, an adhesive, a bonding process (e.g., chemical bonding, thermal bonding, laser welding, use of a cement, etc.), and the like. In some embodiments, a moisture-tight seal may be formed between each plug 142, 144 and the housing 102. A plug 142, 144 may be configured to maintain or substantially maintain an original appearance of the electronic device 100. Alternatively, a plug 142, 144 may comprise a transparent element (e.g., a window, an optical element (e.g., a lens, etc.), or the like).

Instead of using an access location 134, 136 to apply a protective coating to one or more features or components within an electronic device 100, one or more access locations 134, 136 may be used to apply a mask or coating release element to one or more features or components within the electronic device 100 and, thus, prevent a protective material that enters the interior of the electronic device 100 from coating the masked features or components. Of course, one or more access locations 134, 136 may be used to prevent the application of a protective film to features or components within the interior of the electronic device 100, while one or more other access locations 134, 136 may be used to introduce a protective material or a protective coating into the interior of the electronic device 100.

Embodiments of the present disclosure may thus relate to methods in which a previously fully assembled electronic device, including an electronic device that has been purchased by a consumer, or an aftermarket electronic device, is at least partially disassembled to enable a protective coating to be applied to one or more features or components within an interior of the electronic device 100.

Figure 10:
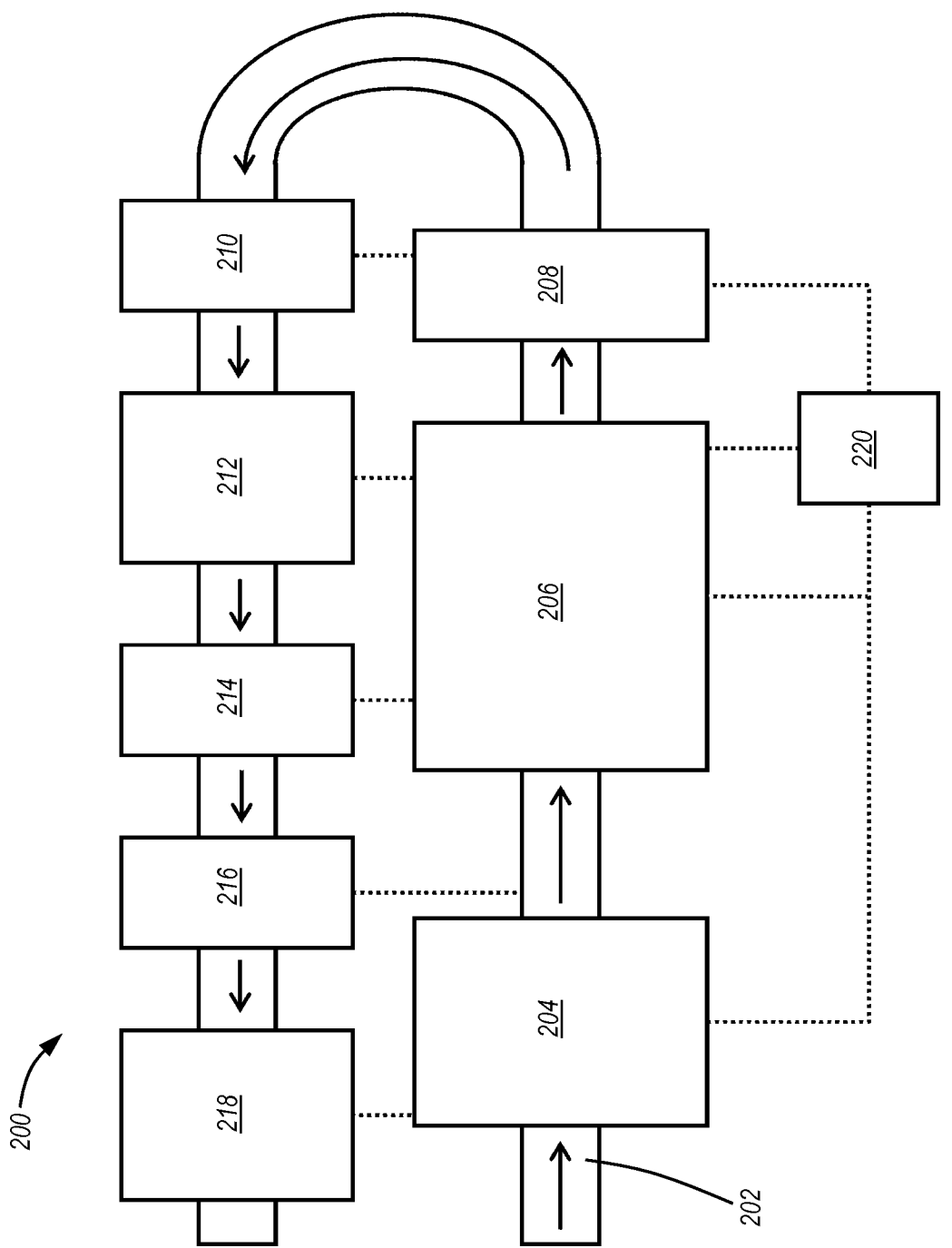
FIG. 10 is a schematic representation of an embodiment of a system for applying protective coatings to electronic devices.

While any suitable techniques may be used to apply one or more protective coatings to an aftermarket electronic device 100 (FIGS. 1, 2, 6-9), FIG. 10 depicts an embodiment of a coating application system 200 that may be configured to apply protective coatings to features or components within the interiors of aftermarket electronic devices. The coating application system 200 may include a conveyor 202 that transports an electronic device 100 (FIGS. 1, 2, 6-9) to be protected. Of course, a conveyor 202 is an optional part of the coating application system 200, and need not be included.

If included, the conveyor 202 may transport the electronic device 100 through any or all of a set of elements 204-218 of the coating application system 200. The conveyor 202 may comprise part of a production line, or it may include elements that enable it to carry one or more electronic devices 100 away from a production line to off-line elements. For instance, elements of the coating application system 200 may be online, while other elements (e.g., a coating element, etc.) may be off-line. The conveyor 202 may transport electronic devices 100 between on-line components, or even from an online component to an offline component and/or from an offline component to an online component.

The conveyor 202 may include a number of components for transporting individual electronic devices 100 or groups of electronic devices 100 to and from various components of the coating application system 200. Although the illustrated embodiment of conveyor 202 is configured to sequentially pass one or more electronic devices 100 through multiple elements 204-218 of the coating application system 200, it should be appreciated that the conveyor 202 may provide multiple routing options, including, without limitation, the ability to cause one or more electronic devices 100 to bypass an element 204-218 of the coating application system 200, the ability to return one or more electronic devices 100 to an element 204-218, or any of a variety of other functions that relate to the routing of electronic devices 100 into, through or out of the coating application system 200.

In the illustrated embodiment, the conveyor 202 may be configured to transport one or more electronic devices 100 that are to be protected to or through an inspection or identification element 204 and/or to a disassembly element 206. The inspection or identification element 204 may be used to evaluate an electronic device 100, and to determine whether or not the electronic device 100 is in working condition or is otherwise suited for processing by the coating application system 200. The inspection or identification element 204 may detect which electronic device(s) 100 is (are) to be protected, ensure that each electronic device 100 is properly oriented and/or perform any of a variety of other functions. Identification of the electronic device 100 (e.g., an electronic device 100 of a particular type, an indicator, or indicia, (e.g., text, a bar code, a quick response (QR code, a radio-frequency identification (RFID) tag, etc.) that has been associated with the electronic device 100 to dictate the type of processing to which the electronic device 100 is to be subjected, etc.) may be used to determine how the coating application system 200 will operate. In a specific embodiment, a processing element may be programmed to correlate information about the identity of a particular electronic device 100 to a specific process protocol, or program, which may control or otherwise cause various elements of the coating application system 200 to operate in a manner that will route, process and apply one or more protective coatings to the electronic device 100 in a predetermined, or programmed, manner. The inspection or identification element 204 may provide identifying information that corresponds to a particular electronic device 100 or group of electronic devices 100 to processing equipment located downstream from the coating application system 200, or even to processing equipment upstream of the coating application system 200 (e.g., for feedback control of electronic devices 100 that are to be subsequently processed in the same manner; to provide the processing equipment with additional data on which feedback controls may be based, or "teach" the processing equipment; etc.). If an electronic device 100 fails inspection or cannot be identified by the inspection or identification element 204, the electronic device 100 may optionally be removed from the coating application system 200.

The conveyor 202 may transport an electronic device 100 from the inspection or identification element 204, if any, to the disassembly element 206. At the disassembly element 206 each electronic device 100 handled by the coating application system 200 is at least partially disassembled; i.e., at least a portion of an interior of each electronic device 100 is exposed. Disassembly may occur as disclosed herein. In some embodiments, disassembly may include removing some or all of the electrical components from a remainder of the electronic device 100 or a subassembly of the electronic device 100. For instance, a power supply (e.g., a battery etc.), a circuit board, a memory or storage device, an audio component (e.g., a speaker, a microphone, etc.), an optical component, or the like may be wholly or partially removed from the electronic device 100 during disassembly.

In some cases, disassembly may occur with detachable and selectively removable components. In other embodiments, disassembly may occur using components intended to remain semi-permanently or permanently connected (e.g., when restricted from disassembly using conventional mechanisms, etc.). Information from the inspection or identification element 204 may be used to determine the manner in which an electronic device 100 is disassembled, as well as the extent of disassembly, by the disassembly element 206 (e.g., by providing an individual with disassembly instructions, by identifying a program for automated disassembly of the electronic device 100, etc.).

A disassembled electronic device 100, either in whole or in part, may be transported (e.g., using the conveyor 202, etc.) to a masking element 208 of the coating application system 200. Use of the masking element 208 may be optional and, in some embodiments, whether or not it is used and the manner in which it is used may be based on the identity or other information associated with the disassembled electronic device 100, which may, in some embodiments, be obtained with an inspection or identification element 204. The masking element 208 may be used to apply masks or coating release elements to one or more features or components of the disassembled electronic device 100 (e.g., contact pads, terminals, audio interfaces (e.g., speakers, microphones, etc.), etc.). Masks or coating release elements applied by the masking element 208 may be configured to prevent or inhibit adherence of a protective coating to surfaces, features or components on which the masks or coating release elements reside.

Some embodiments of a coating application system 200 may include one or more surface treatment elements 210. A surface treatment element 210 may be configured to prepare a surface of an electronic device 100 for application of a protective coating. In some embodiments, a surface treatment element 210 may be configured to enhance adhesion of a protective coating to at least a portion of the electronic device 100. A surface treatment element 210 may be configured to modify a surface (e.g., by defining a texture, by defining one or more surface features, etc.) of the electronic device 100, at least a portion of the surface, or some or all of a surface of a protective coating on one or more features or components of the electronic device 100. Modification of a surface may impart the surface with at least one desired characteristic (e.g., a texture that will enhance adhesion of a protective coating to the modified surface; smoothness that will minimize adhesion of a mask or protective coating to the modified surface; moisture repellency, as provided by so-called "lotus leaf" structures; etc.). Alternatively, or in addition, a surface treatment element 210 may clean one or more surfaces of an electronic device 100 before or after a protective coating has been applied to at least portions of the electronic device 100.

The coating application system 200 includes one or more coating elements 212. Each coating element 212 may be configured to receive and apply protective coatings to a plurality of substrates (e.g., electronic devices, etc.) (e.g., tens of units, hundreds of units, etc.) at a time. In embodiments where the coating application system 200 includes a plurality of coating elements 212, all of the coating elements 212 may be configured to apply the same type of protective coatings in the same manner as one another, or different coating elements 212 may be configured to apply different types of protective coatings and/or to apply protective coatings in a different manner from one another. While a single coating element 212 is illustrated, the inclusion of two or more coating elements 212 in the coating application system 200 may further optimize the application of protective coatings to critical features of the electronic device 100. In some embodiments, the coating element 212 is configured to apply a protective coating to one or more exposed surfaces of an electronic device 100, or to disassembled components that are to be reassembled with the electronic device 100, and that will ultimately be located at least partially within an interior of, or even internally confined within, the housing 102 (FIGS. 1, 6-9) of the electronic device 100 once it is reassembled.

In a specific embodiment, the coating element 212 may be configured to form reactive species (e.g., monomers, etc.) and to initiate polymerization and deposition of a protective coating onto exposed portions of the electronic device 100. In some embodiments, the coating element 212 may deposit or otherwise apply a protective coating in the form of a film within a relatively short period of time, but having a sufficient density and/or thickness to provide a desired level of moisture resistance (e.g., impermeability, repellency, etc.). In various embodiments, the coating element 212 may deposit or otherwise form a film (e.g., a Parylene film, etc.) at a rate (minimum, average, etc.) of at least one micron per hour, per half hour, per quarter hour, per ten minutes, per five minutes, per two minutes, or even less.

Examples of suitable coating elements 212 are described in U.S. patent application Ser. Nos. 12/104,080, 12/104,152, 12/988,103, 12/446,999, 12/669,074 and 12/740,119. More particular examples of coating elements 212 may include, without limitation, molecular diffusion equipment, CVD equipment, PVD equipment, physical application apparatuses, or other apparatus or combinations of any of the foregoing.

A coating application system 200 may include at least one coating inspection element 214 located downstream from the coating element 212. Each coating inspection element 214 may enable an analysis of the presence of a protective coating, the thickness of the protective coating, the surfaces on which the protective coating resides, the quality of the protective coating, or any other useful information about a protective coating that has been applied by a coating element 212 to an electronic device 100. Information from a coating inspection element 214 may be used to provide feedback control over a coating element 212 of the coating application system 200.

According to some embodiments, a coating application system 200 may include a material removal element 216. The material removal element 216 may be configured to selectively remove material from one or more regions of a protective coating. Such material removal may be effected by any suitable means, without detrimentally affecting underlying or adjacent portions of the electronic device 100 under from which the material is removed. As an example, the material removal element 216 may be configured to ablate, vaporize or sublimate the material of a water-resistant coating (e.g., with a properly placed, pulsed or continuous laser beam, etc.). As another example, the material removal element 216 may selectively apply a solvent (e.g., by inkjet processes, screen printing, etc.) that will selectively remove a material of a protective coating on an electronic device 100. In yet another example, the material removal element 216 may be configured to mechanically remove material from one or more selected regions of a protective coating (e.g., by cutting, ablation, abrading, etc.). In still other embodiments, the material removal element 216 may operate as a de-masking element to remove all or some masking components applied by the masking element 208.

The coating application system 200 may also include a reassembly element 218, which may be configured to reassemble an electronic device 100 (i.e., to reduce or eliminate exposure of features or components within an interior of the electronic device 100).

The operation of the reassembly element 218 may substantially reverse the processes or actions performed by the disassembly element 206. In some embodiments, the reassembly element 218 may be configured to reassemble two or more components, including portions of a housing, internal components (e.g., in a manner known in the art, etc.), and the like, and secure the reassembled components to one another. The reassembly element 218 may be configured to plug or cap one or more openings formed in a housing 102 or body of the electronic device 100.

As discussed herein, the coating application system 200 may be fully or partially automated. In some such embodiments, and as depicted in FIG. 10, the coating application system 200 may include a controller 220 that may control operation of the conveyor 202, any of the elements 204-218 or any combination of the conveyer 202 and elements 204-218. Without limitation, the controller 220 may be configured to manage throughput, route electronic devices 100 to suitable elements (or to components within elements 204-218), and the like. The controller 220 may also be used to communicate information between elements 204-218, such as information regarding the type of electronic device 100 being processed for suitable disassembly, inspection, cleaning, masking, coating, reassembly, and the like.

In some embodiments, once a coating application system 200 has been used to apply one or more protective coatings to one or more substrates each substrate may be tested to confirm that it functions as intended. In embodiments where a substrate comprises an electronic device 100, the protected electronic device 100 may be tested in any suitable manner to confirm that the electronic device 100 was not damaged by any of the processes performed by the coating application system 200.

Although the foregoing description provides many specifics, these should not be construed as limiting the scope of any of the appended claims, but merely as providing information pertinent to some specific embodiments that may fall within the scopes of the appended claims. Other embodiments of the disclosed subject matter may also be devised which lie within the scopes of the appended claims. In addition, features from different embodiments may be employed in combination. The scope of each claim is indicated and limited only by its plain language and the legal equivalents to its elements. All additions, deletions and modifications to the subject matter disclosed herein that fall within the scopes and meanings of the claims are to be embraced by the claims.

What is claimed:

1. A method for applying a protective coating to a previously fully assembled electronic device, comprising:
   at least partially disassembling an electronic device from a fully assembled arrangement to an at least partially disassembled arrangement to expose one or more internal surfaces, features or components of the electronic device;
   after at least partially disassembling, placing a portion of the electronic device in the at least partially disassembled relationship, including the one or more internal surfaces, features or components within a coating chamber;
   applying a mask to at least a portion of at least one of the one or more internal surfaces, features or components;
   applying a mask to at least a portion of a housing of the electronic device, the housing defining an exterior of the electronic device;
   applying a protective coating to at least some of the internal surfaces, features or components of the electronic device in the at least partially disassembled relationship and to the mask while at least the portion of the electronic device in the at least partially disassembled relationship resides within the coating chamber;
   after applying the protective coating, removing a periphery of protective coating around the mask and any portion of the protective coating located over the mask; and
   reassembling the electronic device to re-place the electronic device in the fully assembled arrangement, the protective coating being located at least partially within an interior of the electronic device in the fully assembled arrangement.

2. The method of claim 1, wherein at least partially disassembling includes removing a first portion of a housing of the electronic device from a second portion of the housing.

3. The method of claim 2, wherein at least partially disassembling includes removing a selectively detachable portion of the housing from a remainder of the housing.

4. The method of claim 1, wherein at least partially disassembling includes removing a portion of a housing of the electronic device.

5. The method of claim 4, wherein reassembling includes closing an opening formed by removing material from an exterior of the electronic device.

6. The method of claim 1, wherein at least partially disassembling includes removing one or more components from the electronic device and excluding the one or more components from applying the protective coating.

7. The method of claim 1, wherein applying the protective coating comprises depositing a coating comprising a poly (p-xylylene).

8. The method of claim 7, wherein placing the portion of the electronic device within the coating chamber comprises placing the portion of the electronic device into a chamber of an apparatus for depositing the poly(p-xylylene).

9. The method of claim 1, further comprising: preventing application of the protective coating to one or more portions of the electronic device.

10. The method of claim 9, wherein preventing includes restricting application of the protective coating to one or more peripheral or exterior surfaces of the electronic device.

11. The method of claim 9, wherein preventing includes preventing application of the protective coating to electrical connectors of the electronic device.

12. The method of claim 9, wherein preventing includes: after applying the protective coating, removing a portion of the protective coating from one or more surfaces, features or components of the electronic device.

13. The method of claim 1, wherein applying the protective coating occurs while the one or more internal surfaces, features or components are carried by a housing of the electronic device.

14. The method of claim 1, wherein applying the protective coating occurs while the one or more internal surfaces, features or components are separated from a housing of the electronic device.

15. The method of claim 1, wherein reassembling includes at least one of:
    reattaching at least two portions of the electronic device that form an exterior of the electronic device;
    reestablishing one or more electrical connections between elements or components of the electronic device; and
    reinstalling an interior component in a remainder of the electronic device.

16. A method for applying a protective coating to an internal surface, feature or component of an electronic device, comprising:
    obtaining an electronic device in a fully assembled arrangement;
    exposing an interior portion of the electronic device, comprising removing at least one component from an interior of a housing of the electronic device;
    after removing the at least one component from the interior of the housing, applying a mask to at least a portion of the at least one component and applying a mask to at least a portion of a housing of the electronic device, the housing defining an exterior of the electronic device;
    applying a protective coating to one or more surfaces of the at least one component that were previously confined within the interior of the housing of the electronic device and to the mask; and
    cutting a periphery of the mask and a portion of the protective coating over the mask from the at least one component.

17. The method of claim 16, further comprising: preventing the protective coating from adhering to an exterior of the electronic device.

18. The method of claim 16, wherein exposing comprises defining an opening through an exterior of the electronic device.

19. The method of claim 16, further comprising: minimizing or eliminating exposure of the interior portion of the electronic device to an environment outside of the electronic device.

20. A method for applying a protective coating to an internal surface, feature or component of an electronic device, comprising:
    inspecting the electronic device to determine if the electronic device is in working condition and determine which components are to be coated;
    exposing an interior portion of the electronic device, comprising at least partially disassembling the electronic device to remove at least one component from an interior of the electronic device;
    selectively applying a coating release element to at least one location of the at least one component previously confined within an interior of the electronic device;
    selectively applying a mask material to the at least one location of the at least one component previously confined within an interior of the electronic device and to the housing defining an exterior of the electronic device;
    introducing the at least one component that has been removed from the interior of the electronic device into a parylene coating chamber;
    while the at least one component that has been removed from the interior of the electronic device is within the parylene coating chamber, applying a protective coating to one or more surfaces of the at least one component that were previously confined within an interior of the electronic device and that are exposed beyond the mask material, and to the mask material; and
    removing the mask material and a portion of the parylene coating located over the mask material from the at least one component and to the housing defining an exterior of the electronic device, portions of the parylene coating that cover the one or more surfaces of the at least one component that were previously confined within an interior of the electronic device and that were exposed beyond the mask material remaining on the at least one component.

21. The method of claim 20, wherein removing the mask material includes:
    cutting, scoring, perforating or focused removal of the protective coating at locations adjacent to the mask material; and
    lifting the mask material and a portion of the protective coating thereover away from the at least one location.

22. The method of claim 21, wherein removing the portion of the parylene coating includes:
    cutting, scoring, perforating or focused removal of the parylene coating at locations adjacent to the mask material; and
    lifting the portion of the parylene coating away from the at least one location.

23. A method for applying a protective coating to an internal surface, feature or component of an electronic device, comprising:
    at least partially disassembling an electronic device to remove at least one component from an interior of the electronic device and to expose an interior portion of the at least one component of the electronic device;
    after removing the at least one component from the interior of the housing, applying a mask and a coating release element to at least a portion of the at least one component and to the housing defining an exterior of the electronic device;
    applying a protective coating to one or more surfaces of the at least one component and housing defining an exterior of the electronic device that were previously confined within the interior of the electronic device and to the mask;

removing the mask and a portion of the protective coating on the mask from at least portion of the at least one component and housing defining an exterior of the electronic device;

inspecting the protective coating applied to the electronic device; and reassembling the electronic device after applying the protective coating and removing the mask.

24. The method of claim 23, wherein inspecting the protective coating includes inspecting the thickness of the coating applied to the electronic device.

* * * * *